(12) United States Patent
Kashiwagi et al.

(10) Patent No.: US 11,177,828 B2
(45) Date of Patent: Nov. 16, 2021

(54) DATA COLLECTION APPARATUS, METHOD, AND PROGRAM

(71) Applicant: Mitsubishi Electric Corporation, Tokyo (JP)

(72) Inventors: Ryo Kashiwagi, Tokyo (JP); Osamu Nasu, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 17/284,792

(22) PCT Filed: Dec. 27, 2018

(86) PCT No.: PCT/JP2018/048309
§ 371 (c)(1),
(2) Date: Apr. 13, 2021

(87) PCT Pub. No.: WO2020/136842
PCT Pub. Date: Jul. 2, 2020

(65) Prior Publication Data
US 2021/0318665 A1    Oct. 14, 2021

(51) Int. Cl.
*H03M 13/09*     (2006.01)
*G05B 19/05*     (2006.01)
(Continued)

(52) U.S. Cl.
CPC ........ *H03M 13/095* (2013.01); *G05B 19/056* (2013.01); *G05B 19/058* (2013.01);
(Continued)

(58) Field of Classification Search
CPC .... H03M 13/05; H03M 13/09; H03M 13/095; G05B 19/04; G05B 19/056; G05B 19/058; G05B 23/0224
See application file for complete search history.

(56) References Cited

U.S. PATENT DOCUMENTS 8,862,966 B2 * 10/2014 Nygren ............... G06F 13/4243
714/775
2004/0122537 A1 * 6/2004 Kouda .................. G06F 8/654
700/90
(Continued)

FOREIGN PATENT DOCUMENTS

JP    2006-236301 A    9/2006
JP    2010-141654 A    6/2010
(Continued)

OTHER PUBLICATIONS

International Search Report and Written Opinion dated Mar. 5, 2019, received for PCT Application PCT/JP2018/048309, Filed on Dec. 27, 2018, 6 pages including English Translation.
(Continued)

*Primary Examiner* — Shelly A Chase
(74) *Attorney, Agent, or Firm* — Xsensus LLP

(57) ABSTRACT

A collector included in a data collection apparatus performs data collection to collect data from a PLC. A controller included in the data collection apparatus determines whether the collector is valid depending on whether the collector at a time when an instruction to start the data collection is provided matches the collector at a preset time, and causes the collector to start the data collection in response to the collector being valid.

13 Claims, 15 Drawing Sheets

(51) Int. Cl.
*G05B 23/02* (2006.01)
*H04L 1/00* (2006.01)
*G06F 13/42* (2006.01)

(52) U.S. Cl.
CPC ........ *G05B 23/0224* (2013.01); *H03M 13/09* (2013.01); *G05B 2219/14006* (2013.01); *G05B 2219/14114* (2013.01); *G06F 13/4243* (2013.01); *H04L 1/0045* (2013.01)

(56) References Cited

U.S. PATENT DOCUMENTS

| | | | | |
|---|---|---|---|---|
| 2013/0227379 | A1* | 8/2013 | Gupta | H03M 13/09 714/807 |
| 2013/0318260 | A1* | 11/2013 | Watabe | G06F 5/12 710/53 |
| 2016/0359866 | A1 | 12/2016 | Mixer | |

FOREIGN PATENT DOCUMENTS

| JP | 2015-184849 A | 10/2015 |
|---|---|---|
| JP | 2017-4521 A | 1/2017 |

OTHER PUBLICATIONS

Notice of Reasons for Refusal dated Sep. 3, 2019, received for JP Application 2019-534418, 6 pages including English Translation.
Decision to Grant dated Dec. 3, 2019, received for JP Application 2019-534418, 5 pages including English Translation.

* cited by examiner

FIG.4

COLLECTION SETTING STORAGE ~130

| No. | DEVICE NAME | DATA NAME | SETTING DETAILS | EXECUTION FILE NAME | PATH | ERROR DETECTION CODE |
|---|---|---|---|---|---|---|
| 1 | PLC 604 | VIBRATION 1 | IP ADDRESS:XXXX, PORT NO.:XX, LOCATION:XXX, DATA TYPE: XX, DATA LENGTH:XX, COLLECTION INTERVAL:XXX | EXECUTION FILE 001 | ... | 3286575848 |
| 2 | PLC 605 | VIBRATION 2 | IP ADDRESS:XXXX, PORT NO.:XX, LOCATION:XXX, DATA TYPE: XX, DATA LENGTH:XX, COLLECTION INTERVAL:XXX | EXECUTION FILE 002 | ... | 1525447506 |
| 3 | PLC 604 | TEMPERATURE 1 | IP ADDRESS:XXXX, PORT NO.:XX, LOCATION:XXX, DATA TYPE: XX, DATA LENGTH:XX, COLLECTION INTERVAL:XXX | EXECUTION FILE 003 | ... | 770395076 |

FIG.6A

| COLLECTION SETTING: ACCESS DESTINATION DEVICE | |
|---|---|
| DEVICE NAME | PLC602 |
| IP ADDRESS | XXXX |
| PORT NO. | XX |

[NEXT] [CANCEL]

FIG.6B

COLLECTION SETTING: COLLECTION DATA

DEVICE NAME | PLC 602

DATA | COLLECTION INTERVAL

INPUT SETTINGS ON DATA OF DATA COLLECTION TARGET.

| No. | DATA NAME | LOCATION (FIRST) | LOCATION (LAST) | DATA TYPE | NUMBER OF CHARACTERS |
|---|---|---|---|---|---|
| | | | | | |
| | | | | | |
| | | | | | |
| | | | | | |
| | | | | | |
| | | | | | |
| | | | | | |

REGISTER | RETURN

FIG.6C

```
COLLECTION SETTING: COLLECTION DATA

DEVICE NAME         [ PLC 602 ]

[ DATA ][ COLLECTION
           INTERVAL  ]
 ┌──────────────────────────────────────┐
 │ INPUT COLLECTION INTERVAL            │
 │                                      │
 │ COLLECTION INTERVAL [      ] [ MILLISECONDS ▽ ]
 │                                      │
 └──────────────────────────────────────┘

[ REGISTER ] [ CANCEL ]
```

FIG.8A

DATA COLLECTION

| No. | DEVICE NAME | DATA NAME | SETTING DETAILS | |
|---|---|---|---|---|
| 1 | PLC 604 | VIBRATION 1 | IP ADDRESS:XXXX, PORT NO.:XX, LOCATION:XXX, DATA TYPE: XX, DATA LENGTH:XX, COLLECTION INTERVAL: XXX | START |
| 2 | PLC 605 | VIBRATION 2 | IP ADDRESS:XXXX, PORT NO.:XX, LOCATION:XXX, DATA TYPE: XX, DATA LENGTH:XX, COLLECTION INTERVAL: XXX | START |
| 3 | PLC 604 | TEMPERATURE 1 | IP ADDRESS:XXXX, PORT NO.:XX, LOCATION:XXX, DATA TYPE: XX, DATA LENGTH:XX, COLLECTION INTERVAL: XXX | START |

RETURN

FIG.8B

DATA COLLECTION

DATA COLLECTION NO. 1 HAS FAILED TO START
DUE TO INVALID COLLECTION MODULE.

| No. | DEVICE NAME | DATA NAME | SETTING DETAILS | |
|---|---|---|---|---|
| 1 | PLC 604 | VIBRATION 1 | IP ADDRESS:XXXX, PORT NO.:XX, LOCATION:XXX, DATA TYPE: XX, DATA LENGTH:XX, COLLECTION INTERVAL: XXX | START |
| 2 | PLC 605 | VIBRATION 2 | IP ADDRESS:XXXX, PORT NO.:XX, LOCATION:XXX, DATA TYPE: XX, DATA LENGTH:XX, COLLECTION INTERVAL: XXX | START |
| 3 | PLC 604 | TEMPERATURE 1 | IP ADDRESS:XXXX, PORT NO.:XX, LOCATION:XXX, DATA TYPE: XX, DATA LENGTH:XX, COLLECTION INTERVAL: XXX | START |

RETURN

DATA COLLECTION APPARATUS, METHOD, AND PROGRAM

CROSS-REFERENCE TO RELATED APPLICATION

The present application is based on PCT filing PCT/JP2018/048309, filed Dec. 27, 2018, the entire contents of which are incorporated herein by reference.

TECHNICAL FIELD

The present disclosure relates to a data collection apparatus, a method, and a program.

BACKGROUND ART

Patent Literature 1 describes an input module that operates as data collection means for collecting data from a factory automation (FA) device and transmits the collected data to a controller that controls the FA device. The input module includes definition information that defines information used for communications. The controller includes the same definition information as the input module. The controller receives data from the input module only when the definition information held by the input module matches the definition information held by the controller. When the definition information held by the input module fails to match the definition information held by the controller, the controller determines occurrence of an abnormality and refuses to receive data from the input module.

CITATION LIST

Patent Literature

Patent Literature 1: Unexamined Japanese Patent Application Publication No. 2010-141654

SUMMARY OF INVENTION

Technical Problem

Patent Literature 1 describes stopping of communications between the input module and the controller when an abnormality is caused by corruption of definition information. However, the input module may fail without any abnormality in the definition information, or may be replaced with an invalid module. In such cases, the input module can be invalid and can malfunction also when the controller verifies the definition information with the structure described in Patent Literature 1.

In response to the above issue, an objective of the present disclosure is to prevent malfunction of data collection means for performing data collection to collect data from a FA device when the data collection means is invalid at data collection.

Solution to Problem

To achieve the above objective, collection means included in a data collection apparatus according to an aspect of the present disclosure performs data collection to collect data from a factory automation device. Control means included in the data collection apparatus determines whether the collection means is valid depending on whether the collection means at a time when an instruction to start the data collection is provided matches the collection means at a preset time, and causes, in response to the collection means being valid, the collection means to start the data collection.

Advantageous Effects of Invention

The data collection apparatus according to the above aspect of the present disclosure determines whether the collection means is valid depending on whether the collection means at the time when the instruction to start the data collection is provided matches the collection means at a preset time, and causes, in response to the collection means being valid, the collection means to start the data collection. In the data collection apparatus with this structure, the collection means that is invalid does not start the data collection. The data collection apparatus can thus prevent malfunction of the collection means.

BRIEF DESCRIPTION OF DRAWINGS

FIG. 4 is a table showing an example of data stored in a collection setting storage according to the embodiment;

FIG. 6A is a diagram of an example input screen in the maintenance tool according to the embodiment for inputting an access destination device;

FIG. 6B is a diagram of an example input screen in the maintenance tool according to the embodiment for inputting collection data settings;

FIG. 6C is a diagram of an example input screen in the maintenance tool according to the embodiment for inputting a collection interval;

FIG. 8A is a diagram of an example data collection screen in the maintenance tool according to the embodiment;

FIG. 8B is a diagram of another example data collection screen in the maintenance tool according to the embodiment;

DESCRIPTION OF EMBODIMENTS

Embodiment

A data collection apparatus according to an embodiment of the present disclosure will now be described in detail with reference to the drawings.

Figure 1:
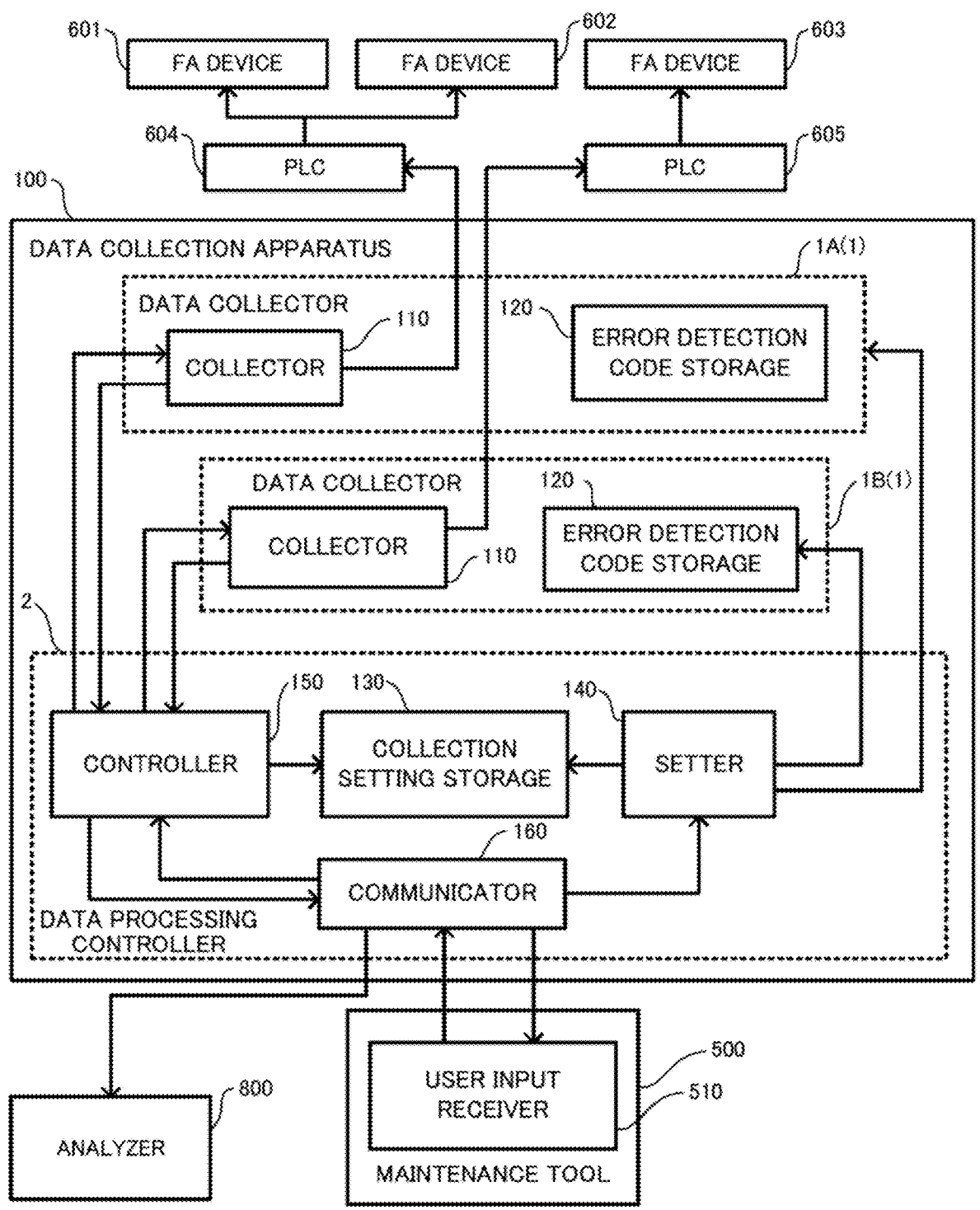
FIG. 1 is a functional block diagram of a data collection apparatus and a maintenance tool according to an embodiment of the present disclosure.

A data collection apparatus 100 shown in FIG. 1 collects data output by factory automation (FA) devices 601, 602, and 603. Examples of the data collection apparatus 100 include an industrial personal computer (IPC). The FA devices 601, 602, and 603 are, for example, mechanical apparatuses used in a production line in a factory. A programmable logic controller 604 (hereafter, a PLC 604) controls the FA devices 601 and 602. A programmable logic controller 605 (hereafter, a PLC 605) controls the FA device 603.

The data collection apparatus 100 collects data acquired by sensors installed in the FA devices 601, 602, and 603 through the PLCs 604 and 605. Examples of the sensors installed in the FA devices 601, 602, and 603 include a vibration sensor, a temperature sensor, a pressure sensor, and a flow rate sensor. Output values from sensors installed in the FA devices 601 and 602 are provided to the PLC 604. Output values from sensors installed in the FA device 603 are provided to the PLC 605. The data collection apparatus 100 collects data of output values of the sensors installed in the FA devices 601 and 602 through the PLC 604. The data collection apparatus 100 collects data of output values of the sensors installed in the FA device 603 through the PLC 605.

In the embodiment, the data collection apparatus 100 determines whether collection means for performing data collection is valid before the data collection, and controls, in response to the collection means being valid, the collection means to start the data collection. The data collection apparatus 100 does not perform data collection when determining that the collection means is invalid. This is because invalid collection means may malfunction when performing data collection, and such a malfunction is to be prevented. Examples of the collection means include a module that performs data collection in the data collection apparatus 100.

The data collection apparatus 100 collects data in accordance with setting details that are the specifications for data collection designated by a user. For example, the data collection apparatus 100 collects designated data in designated cycles from a designated target.

The data collection apparatus 100 also transmits collected data to an analyzer 800. The analyzer 800 analyzes data provided from the data collection apparatus 100 for, for example, preventive or predictive maintenance of the FA devices 601, 602, and 603.

A maintenance tool 500 provides data indicating setting details of collection processing to the data collection apparatus 100 in accordance with operation instructions from a user. The maintenance tool 500 transmits a signal instructing the data collection apparatus 100 to start collection processing in accordance with operation instructions from the user. Examples of the maintenance tool 500 include a personal computer having an installed dedicated application.

Figure 2:
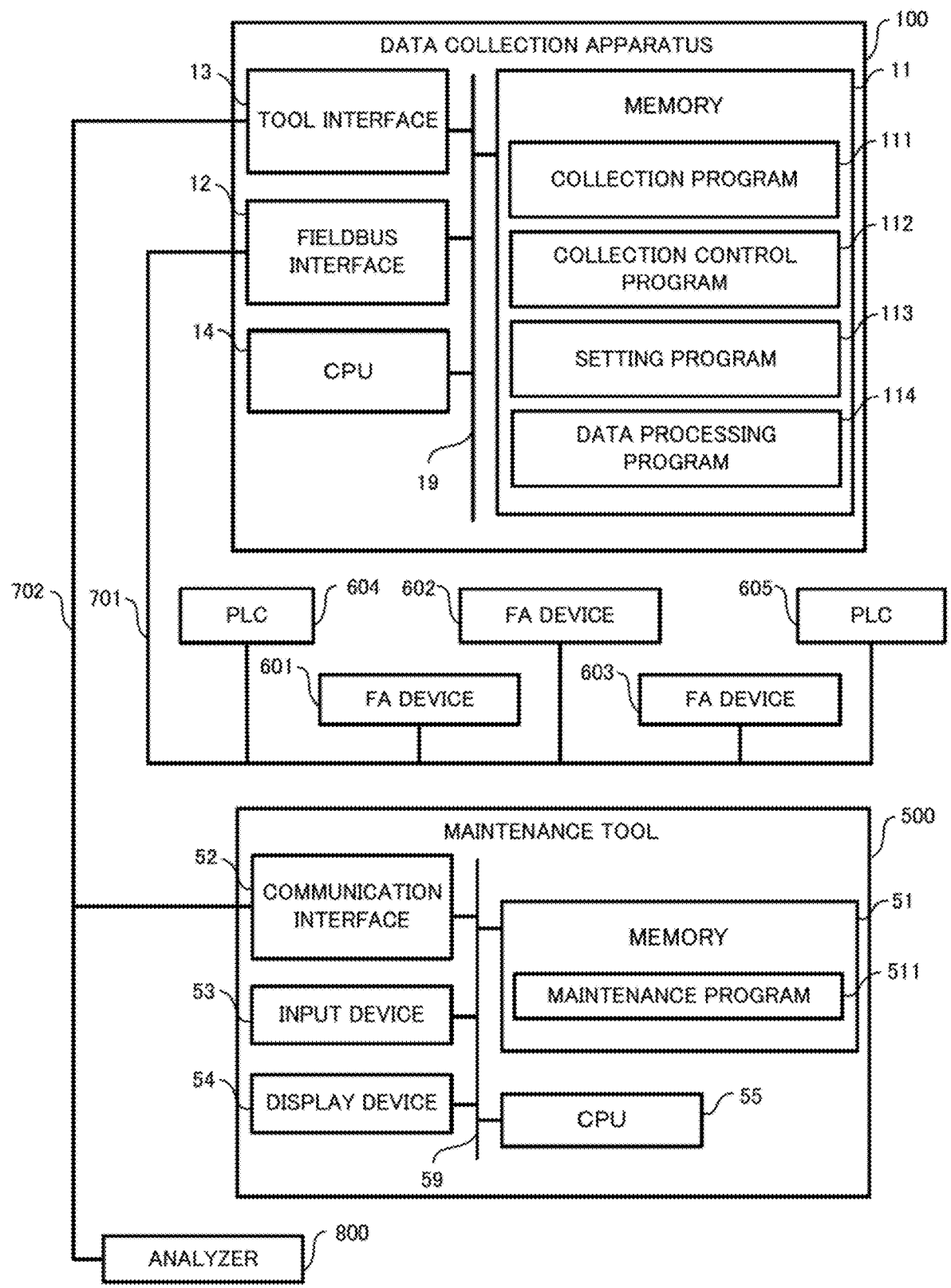
FIG. 2 is a diagram of the data collection apparatus and the maintenance tool according to the embodiment showing the hardware configuration.

As shown in FIG. 2, the data collection apparatus 100 includes, as hardware components, a memory 11 that stores various programs and data, a fieldbus interface 12 that communicates with other apparatuses with a network 701, a tool interface 13 that communicates with other apparatuses with a network 702, and a central processing unit (CPU) 14 that centrally controls the data collection apparatus 100. The memory 11, the fieldbus interface 12, and the tool interface 13 are connected to the CPU 14 with a bus 19 to communicate with the CPU 14.

The memory 11 includes a volatile memory and a non-volatile memory. The memory 11 stores programs for implementing various functions of the data collection apparatus 100. More specifically, the memory 11 stores a collection program 111, a collection control program 112, a setting program 113, and a data processing program 114. The memory 11 is used as a work memory for the CPU 14.

Figure 3A:
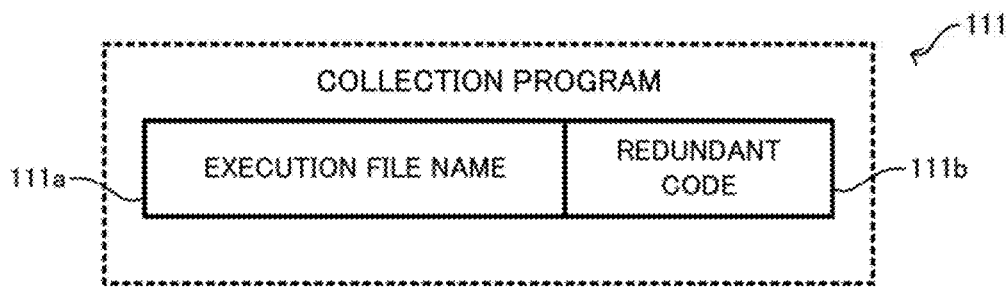
FIG. 3A is a diagram of a collection program according to the embodiment.
Figure 3B:
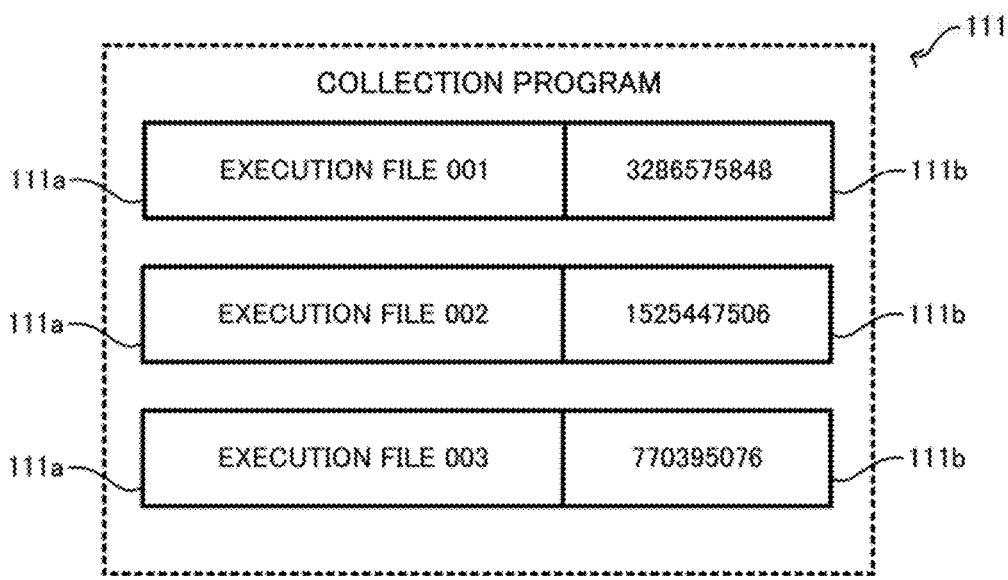
FIG. 3B is a diagram of an example collection program according to the embodiment.

The collection program 111 causes the data collection apparatus 100 to collect data from the PLCs 604 and 605. As shown in FIG. 3A, the collection program 111 includes an execution file 111a and a redundant code 111b, serving as an error detection code of the execution file 111a. For example, when creating the execution file 111a, the programmer generates the redundant code 111b from the execution file 111a, and adds the redundant code 111b to the execution file 111a. The redundant code 111b will be described in detail later. In the embodiment, the data collection apparatus 100 performs multiple steps of data collection in parallel. Thus, as shown in FIG. 3B, the collection program includes multiple execution files 111a. The CPU 14 in the data collection apparatus 100 executes the multiple execution files 111a in parallel in accordance with user instructions.

As shown in FIG. 2, the collection control program 112 causes the data collection apparatus 100 to control start of collection processing. The setting program 113 causes the data collection apparatus 100 to register, to the memory 11, data indicating setting details of data collection provided from the maintenance tool 500. The data processing program 114 causes the data collection apparatus 100 to perform predetermined data processing on data collected by the data collection apparatus 100. Examples of predetermined data processing include missing value processing and outlier processing.

The fieldbus interface 12 includes a network interface circuit and communicates with the FA devices 601 to 603 and the PLCs 604 and 605 with the network 701 as controlled by the CPU 14. The network 701 is in accordance with a fieldbus standard.

The tool interface 13 includes a network interface circuit and communicates with the maintenance tool 500 and the analyzer 800 with the network 702 as controlled by the CPU 14. For example, the network 702 is in accordance with a standard such as 10BASE-T or 100BASE-T.

The CPU 14 executes various programs stored in the memory 11 and implements various functions of the data collection apparatus 100. More specifically, the CPU 14 executes the collection program 111 to collect data from the PLCs 604 and 605. The CPU 14 executes the collection control program 112 to determine whether to start collection processing depending on whether the collection program 111 is valid, and to control start of collection processing. The CPU 14 executes the data processing program 114 to perform predetermined data processing on data collected from the PLC 604. The CPU 14 executes the setting program 113 to store data indicating setting details of collection processing and provided from the maintenance tool 500 into the memory 11.

The maintenance tool 500 includes, as hardware components, a memory 51 that stores various programs and data, a communication interface 52 that communicates with other apparatuses with the network 702, an input device 53 that detects input operations of the user, a display device 54 that outputs images, and a CPU 55 that centrally controls the maintenance tool 500. The memory 51, the communication interface 52, the input device 53, and the display device 54 are connected to the CPU 55 with a bus 59 to communicate with the CPU 55.

The memory 51 includes a volatile memory and a non-volatile memory. The memory 51 stores a program for implementing various functions of the maintenance tool 500. The memory 51 is used as a work memory for the CPU 55. More specifically, the memory 51 stores a maintenance program 511.

The maintenance program 511 causes the maintenance tool 500 to transmit data indicating setting details of collection processing input by the user to the data collection apparatus 100, and to transmit a data collection start instruction to the data collection apparatus 100 in accordance with operation instructions from the user.

The communication interface 52 includes a network interface circuit and communicates with the data collection apparatus 100 with the network 702 as controlled by the CPU 55. The input device 53 includes a mouse and operation keys, receives operation inputs from the user, and outputs a signal indicating the operation inputs from the user to the CPU 55. The display device 54 includes a display, and displays images based on the signal provided from the CPU 55 on the display.

The CPU 55 executes various programs stored in the memory 51 and implements various functions of the maintenance tool 500. More specifically, the CPU 55 executes the maintenance program 511 to transmit data indicating setting details of collection processing input by a user to the data collection apparatus 100. The CPU 55 executes the maintenance program 511 to transmit a signal instructing the data collection apparatus 100 to start data collection.

The functional components of the data collection apparatus 100 will now be described with reference to FIG. 1. The data collection apparatus 100 includes, as functional components, data collectors 1A and 1B that each collect data from a designated data collection target, and a data processing controller 2 that controls the data collectors 1A and 1B.

The data collector 1A includes a collector 110 that performs collection processing and an error detection code storage 120 that stores an error detection code of the collector 110. The data collector 1A described below as an example has the same structure as the data collector 1B. The data collectors 1A and 1B may be collectively referred to as a data collector 1.

Upon receiving a signal instructing the start of collection processing from a controller 150, the collector 110 starts and performs collection processing in accordance with setting details of collection processing stored in a collection setting storage 130. The collector 110 outputs the collected data to the controller 150. The functions of the collector 110 are implemented by the CPU 14 shown in FIG. 2 executing the execution files 111a in the collection program 111 shown in FIG. 3B. The collector 110 is an example of collection means according to the present disclosure.

The error detection code storage 120 stores error detection codes calculated in advance for the collector 110. The error detection codes stored in the error detection code storage 120 are used by the controller 150 to determine whether the collector 110 is valid. Examples of the error detection codes include hash values output by cyclic redundancy checks such as CRC-32, CRC-16, and CRC-8, or the message digest algorithm 5 (MD5). In the embodiment, CRC-32 values are used.

More specifically, when a programmer creates the execution files 111a shown in FIG. 3B to implement the functions of the collector 110, the programmer generates CRC-32 values from the execution files 111a. As shown in FIG. 3A, the programmer adds the generated CRC-32 value to the corresponding execution file 111a as the redundant code 111b, and stores the execution file 111a and the redundant code 111b into the memory 11. The redundant code 111b generated in advance from the execution file 111a serves as the error detection code of the execution file 111a. The error detection code is an example of a first error detection code according to the present disclosure.

As shown in FIG. 3B, when creating multiple execution files 111a, the programmer is to generate the CRC-32 value from each execution file 111a. The functions of the error detection code storage 120 shown in FIG. 1 are implemented by the memory 11 shown in FIG. 2. The error detection code storage 120 is an example of individual information storage means according to the present disclosure.

As shown in FIG. 1, the data processing controller 2 includes the collection setting storage 130 that stores data indicating setting details of data collection, the controller 150 that controls the collectors 110, a setter 140 that sets the setting details of data collection indicated by data to the data collection apparatus 100, and a communicator 160 that communicates with the maintenance tool 500.

The collection setting storage 130 stores data indicating setting details of data collection performed by the data collection apparatus 100 for each collector 110. The data indicating setting details of data collection performed by the data collection apparatus 100 may also be referred to as setting data. The setting data includes information designated by the user, including information identifying the data collection target, information identifying data to be collected, and the collection interval at which data is collected. The setting data also includes information identifying the collection program 111 that implements the functions of the collector 110 and error detection codes for the program. The collection interval included in the setting data is an example of time interval information according to the present disclosure.

FIG. 4 shows an example of data stored in the collection setting storage 130. The data includes a device name of the device serving as a data collection target, the data name, the setting details, the name of the execution file that performs data collection and the path, and the error detection code calculated in advance for the program. The device name and the setting details are designated by the user. The setting details include an Internet protocol (IP) address and the port number of the data collection target device, the location of data to be collected, and the data type and data length of data to be collected.

The location of data to be collected indicates the storage location of the target data in the memory area of the PLC 604 or 605. The PLCs 604 and 605 store data provided from the respective FA devices to the memory areas referred to as device memories. The device memory included in the PLC 604 stores data output by the sensors in the FA devices 601 and 602 controlled by the PLC 604. The device memory included in the PLC 605 stores data output by the sensors in the FA device 603 controlled by the PLC 605. For example, to collect data within a specific range in the device memory, the location includes the value indicating the first data position within the range and the value indicating the last data position within the range.

The execution file name and the path included in the setting data are the name and the path for identifying the program that implements the functions of the collector 110 shown in FIG. 1. More specifically, the file name and the path of an execution file 111a in the collection program 111 shown in FIG. 3B for implementing the functions of the collector 110 are stored in the collection setting storage 130 as the execution file name and the path.

In the embodiment, the collectors 110 allocated to data from respective data collection targets collect designated data. For example, one collector 110 collects vibration data per 100 milliseconds from the FA device 601 stored in the device memory in the PLC 604. Another collector 110 collects vibration data per 100 milliseconds from the FA device 602 stored in the device memory in the PLC 604. Still another collector 110 collects vibration data per 100 milliseconds from the FA device 603 stored in the device memory in the PLC 605. Thus, different execution files 111a in the collection program 111 are designated for data items as data collection targets.

The error detection codes shown in FIG. 4 are redundant codes generated in advance from the execution files in the program implementing the functions of the collector 110 shown in FIG. 1. For example, a redundant code generated from the execution file in creation of the execution file is used as the error detection code. More specifically, the value identical to the redundant code 111b added to the execution file 111a in the collection program 111 shown in FIG. 3A is stored in the collection setting storage 130 as the error detection code. The functions of the collection setting storage 130 are implemented by the memory 11 shown in FIG. 2.

The setter 140 shown in FIG. 1 stores the setting data into the collection setting storage 130. More specifically, the setter 140 stores, into the collection setting storage 130, data indicating setting details of data collection provided from the maintenance tool 500, information identifying the program for performing data collection, and the error detection code in a manner associated with each other.

As described above, the collection setting storage 130 stores information identifying the execution file 111a in the collection program 111 that implements the functions of the collector 110 for each item of data as the data collection targets. The setter 140 selects an execution file 111a from the collection program 111 with a predetermined rule as a program for performing data collection, and stores the execution file name and the path for identifying the selected execution file 111a into the collection setting storage 130, as shown in FIG. 4. For example, the setter 140 selects an execution file 111a in the ascending order of the file names of the execution files 111a. The setter 140 stores the redundant code 111b added to the selected execution file 111a into the collection setting storage 130 as the error detection code. Thus, the error detection code stored in the collection setting storage 130 is identical to the redundant code 111b added to the execution file 111a in the collection program 111 shown in FIG. 3B. The functions of the setter 140 are implemented by the CPU 14 shown in FIG. 2 executing the setting program 113.

In response to an instruction from a user to start data collection, the controller 150 shown in FIG. 1 determines whether each collector 110 is valid. When determining that the collector 110 is valid, the controller 150 causes the collector 110 to start data collection.

The controller 150 determines whether the collector 110 is valid in the manner described below. The controller 150 generates an error detection code from the collector 110. More specifically, the controller 150 calculates a CRC-32 value from the corresponding execution file 111a in the collection program 111 shown in FIG. 3B. The controller 150 determines whether the collector 110 is valid depending on whether the calculated CRC-32 value matches the error detection code stored in the collection setting storage 130. The error detection code generated by the controller 150 from the collector 110 is an example of a second error detection code according to the present disclosure. The controller 150 is an example of control means according to the present disclosure.

As described above, the redundant code 111b generated in advance from the execution file 111a is the error detection code of the execution file 111a. For example, when the execution file 111a is corrupted after the execution file 111a is stored in the data collection apparatus 100 and before the data collection is started, the execution file 111a before corrupted and the execution file 111a after corrupted are different. Thus, the CRC-32 value generated in advance from the execution file 111a is different from the CRC-32 value generated from the execution file 111a at the time when the instruction to start data collection is provided. The same applies to when the execution file 111a is replaced with another file.

In response to the two error detection codes matching each other, the controller 150 determines that the collector 110 is valid. The controller 150 activates the collector 110 before providing data, and then provides data used for collection processing to the collector 110. More specifically, the controller 150 activates the collection program 111 implementing the functions of the collector 110 or the execution file 111a in the collection program 111 identified with the execution file name and the path stored in the collection setting storage 130. The controller 150 provides, to the activated program, data stored in the collection setting storage 130 including information identifying the data collection target, information identifying data to be collected, and collection intervals at which data is collected. Thus, the collector 110 collects designated data from the designated target device at designated collection intervals, and provides the collected data to the controller 150. The controller 150 also transmits data collected by the collector 110 to the analyzer 800 through the communicator 160.

In response to the two error detection codes failing to match each other, the controller 150 determines that the collector 110 is invalid. The controller 150 does not cause the collector 110 to start collection processing. The controller 150 also notifies the maintenance tool 500 of the failure in performing collection processing through the communicator 160. The functions of the controller 150 are implemented by the CPU 14 shown in FIG. 2 executing the collection control program 112.

The communicator 160 shown in FIG. 1 communicates with the maintenance tool 500 and the analyzer 800. The communicator 160 outputs data indicating setting details of collection processing received from the maintenance tool 500 to the setter 140. The communicator 160 outputs the signal instructing the start of collection processing received from the maintenance tool 500 to the controller 150. The communicator 160 transmits the notification output by the controller 150 to indicate the failure in performing collection processing to the maintenance tool 500. The communicator 160 transmits data output from the controller 150 and collected by each collector 110 to the analyzer 800. The functions of the communicator 160 are implemented by the CPU 14 and the tool interface 13 shown in FIG. 2.

As shown in FIG. 1, the maintenance tool 500 includes, as a functional component, an input receiver 510. The input receiver 510 transmits data indicating setting details of collection processing received from the user to the data collection apparatus 100. The input receiver 510 transmits a collection processing start instruction received from the user to the data collection apparatus 100. The functions of the input receiver 510 are implemented by the CPU 55 shown in FIG. 2 executing the maintenance program 511.

A method with which a user stores data indicating setting details of collection processing into the data collection apparatus 100 with the maintenance tool 500 will now be described.

Data to be stored in the collection setting storage 130 is registered before data collection. Thus, before instructing the start of data collection, the user stores data indicating setting details of collection processing into the data collection apparatus 100 with the maintenance tool 500 in the manner described below.

Figure 5:
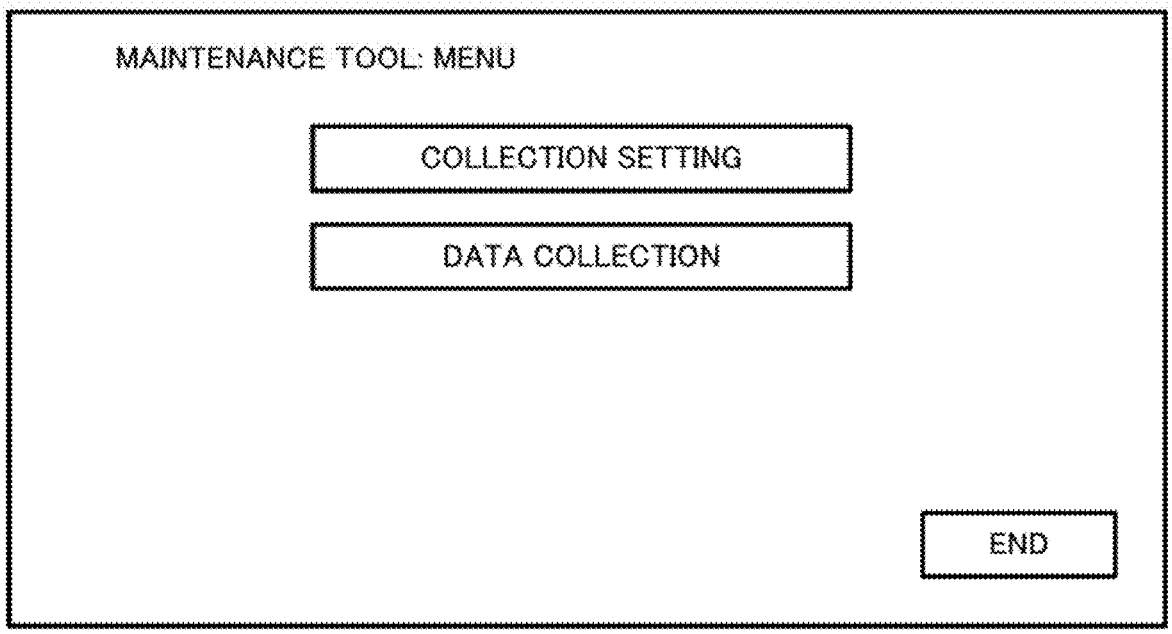
FIG. 5 is a diagram of an example menu screen in the maintenance tool according to the embodiment.

The user first operates the input device 53 shown in FIG. 2 to activate the maintenance program 511. The input receiver 510 displays a menu screen shown in FIG. 5 on the display device 54 in response to the user operation. The user may operate the input device 53 to press a collection setting button on the menu screen. In response to the user operation, the input receiver 510 displays an input screen for inputting an access destination device shown in FIG. 6A on the display device 54. The user may operate the input device 53 to input the device name, the IP address, and the port number on the input screen for inputting an access destination device and press a register button.

In response to the user operation, the input receiver 510 temporarily stores the input device name, the IP address, and the port number into the memory 51. Subsequently, the input receiver 510 displays a collection data input screen shown in FIG. 6B on the display device 54. The input receiver 510 displays, on the collection data input screen, the device name input by the user on the input screen for inputting an access destination device. The user may input each blank on the collection data input screen, and press a collection interval tab. In response to the user operation, the input receiver 510 temporarily stores the input values into the memory 51, and displays a collection interval input screen shown in FIG. 6C on the display device 54. The user may then press a register button. In response to the user operation, the input receiver 510 transmits data indicating the details input by the user on each of the screens shown in FIGS. 6A to 6C to the data collection apparatus 100.

The setter 140 in the data collection apparatus 100 functions in the manner described below when receiving data indicating setting details of collection processing from the maintenance tool 500. The functions of the setter 140 are implemented by the CPU 14 shown in FIG. 2 executing the setting program 113. In this example, no setting data is registered to the collection setting storage 130.

Figure 7:
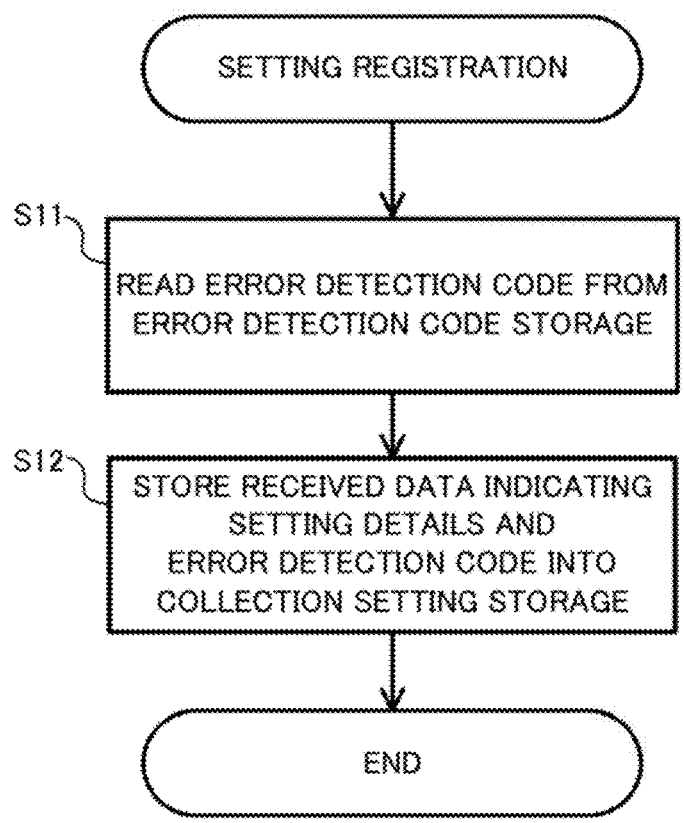
FIG. 7 is a flowchart of setting registration performed by the data collection apparatus according to the embodiment.

The setter 140 starts setting registration shown in FIG. 7 upon receiving data indicating setting details of collection processing from the maintenance tool 500. The setter 140 first reads an error detection code from the error detection code storage 120 in the data collector 1 shown in FIG. 1 (step S11). For example, the file names of the execution files 111a shown in FIG. 3B are sorted in ascending order, causing the execution file 111a named as execution file 001 to be the first. In this case, the setter 140 selects execution file 001, and reads the redundant code 111b serving as the error detection code added to the selected execution file 111a named as execution file 001. When the setting data has been registered to the collection setting storage 130, the setter 140 may sort the file names of the execution files 111a not yet registered to the collection setting storage 130 in ascending order, and select the first execution file 111a as an execution file allocated to the new setting data.

Subsequently, as shown in FIG. 7, the setter 140 stores, as setting data, data indicating setting details of collection processing received from the maintenance tool 500, the execution file name and the path, and the error detection code read in step S11 into the collection setting storage 130 shown in FIG. 4 (step S12). The setting registration is performed in the manner described above.

After registering setting data to the data collection apparatus 100, the user instructs the data collection apparatus 100 to start data collection using the maintenance tool 500 in the manner described below. First, the user operates the input device 53 shown in FIG. 2 to press a data collection button on the menu screen shown in FIG. 5. The input receiver 510 requests data stored in the collection setting storage 130 from the data collection apparatus 100. In response to this request, the data collection apparatus 100 transmits data stored in the collection setting storage 130 shown in FIG. 4 to the maintenance tool 500. As shown in FIG. 8A, the input receiver 510 displays a collection screen including data received from the data collection apparatus 100 on the display device 54.

The user may operate the input device 53 to press a start button on this screen to start intended collection setting. The input receiver 510 transmits a signal indicating the instruction of collection start together with information identifying the selected collection setting to the data collection apparatus 100.

Upon receiving the signal indicating the instruction of collection start from the maintenance tool 500, the data collection apparatus 100 first performs the validness determination described below to determine whether the collector 110 is valid.

Figure 9:
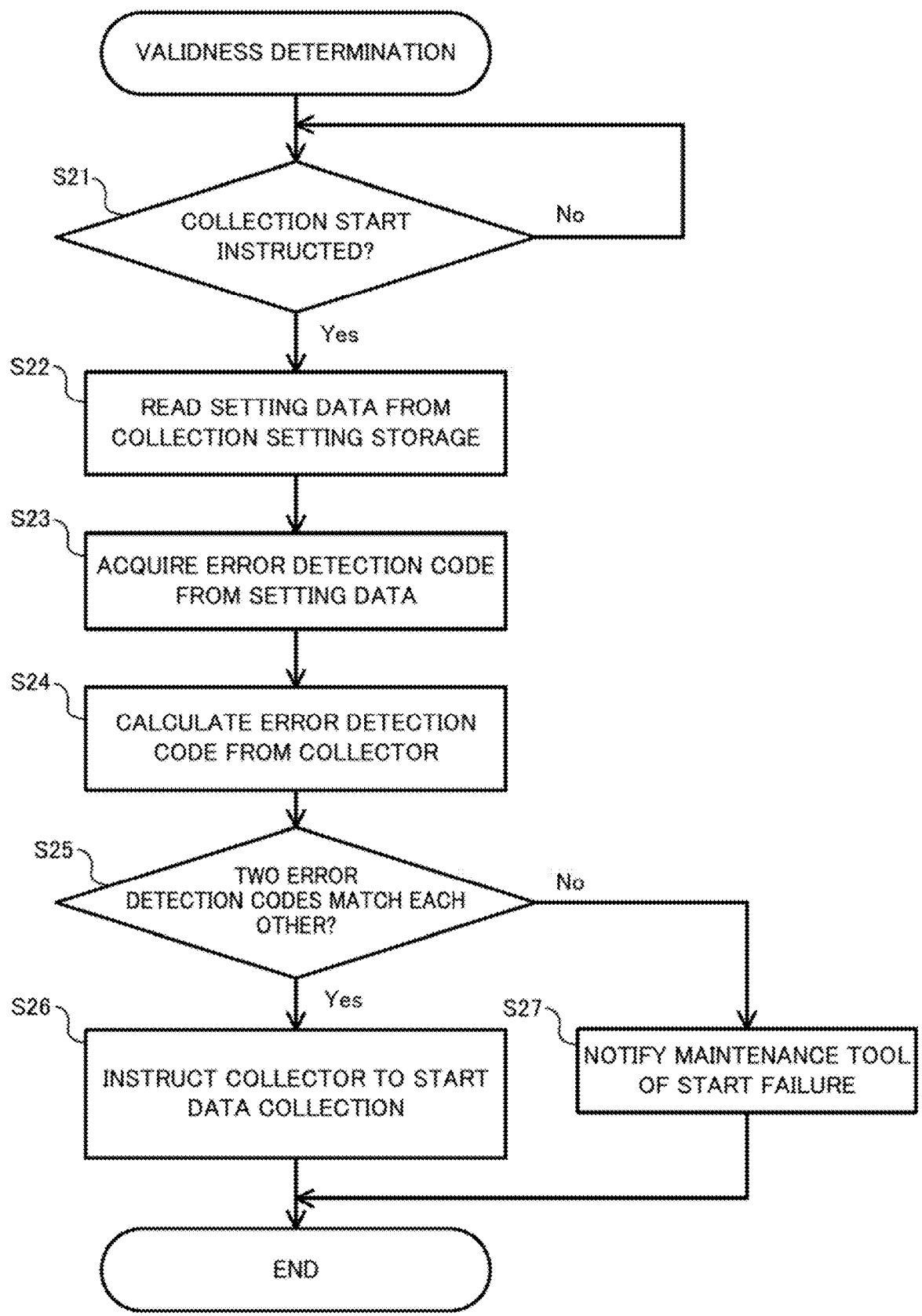
FIG. 9 is a flowchart of validness determination performed by the data collection apparatus according to the embodiment.

As shown in FIG. 9, upon receiving information identifying collection setting selected by the user and the signal indicating the instruction of collection start from the maintenance tool 500 (Yes in step S21), the controller 150 reads the corresponding item of setting data from the collection setting storage 130 (step S22). The controller 150 acquires the error detection code from the setting data read from the collection setting storage 130 (step S23).

Subsequently, the controller 150 calculates an error detection code from the collector 110 to which the collection setting selected by the user is allocated (step S24). More specifically, the controller 150 calculates a CRC-32 value from the execution file 111a identified by the execution file name and the path included in the setting data read in step S22.

The controller 150 determines whether the error detection code acquired in step S23 matches the error detection code calculated in step S24 (step S25). In response to the two error detection codes matching each other (Yes in step S25), the controller 150 outputs the signal instructing the collector 110 to start data collection (step S26). The controller 150 also outputs data indicating setting details to the collector 110 with the signal. The controller 150 may also notify the maintenance tool 500 of the start of data collection. The controller 150 then ends the validness determination. Thus, the collector 110 starts data collection, as will be described later.

In contrast, when the two error detection codes fail to match each other (No in step S25), the controller 150 notifies the maintenance tool 500 of the failure in starting data collection (step S27), and ends the validness determination.

Upon receiving the notification indicating the failure in starting data collection from the data collection apparatus, the maintenance tool 500 displays, for example, a message shown in FIG. 8B on the collection screen.

Figure 10:
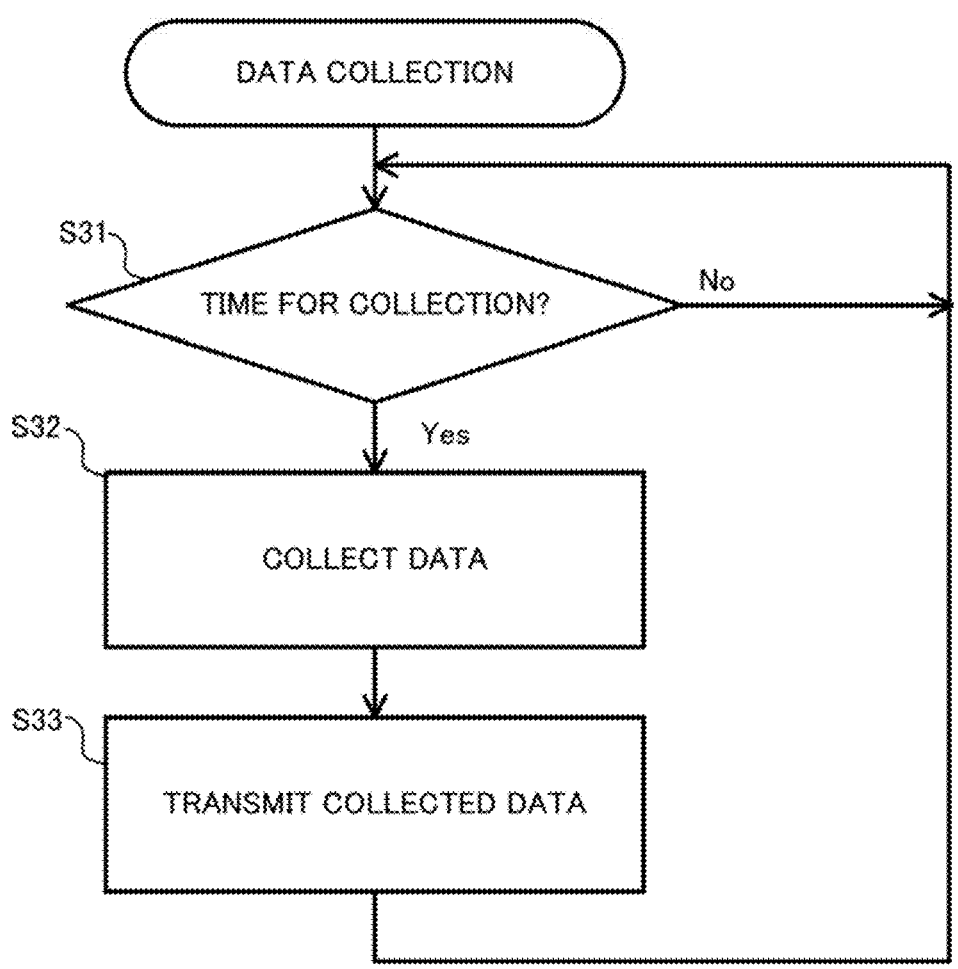
FIG. 10 is a flowchart of data collection performed by the data collection apparatus according to the embodiment.

Upon receiving the signal instructing the start of data collection from the controller 150, the collector 110 performs data collection shown in FIG. 10. The functions of the collector 110 are implemented by the CPU 14 shown in FIG. 2 executing the collection control program 112.

The collector 110 determines whether the time for collection has come based on the value set as the collection interval included in data indicating the setting details provided from the controller 150 (step S31). For example, the collector 110 performs first data collection when the time indicated by the designated collection interval has elapsed after the collector 110 receives the signal instructing the start of data collection from the controller 150. Thereafter, every after the time indicated by the designated collection interval elapses, the collector 110 performs data collection.

When determining that the time for collection has come (Yes in step S31), the collector 110 collects designated data from the target PLC 604 or 605 included in data indicating setting details (step S32), and outputs the collected data to the controller 150. The controller 150 transmits the data provided from the collector 110 to the analyzer 800 through the communicator 160 (step S33).

In the data collection apparatus 100 according to the embodiment, the controller 150 determines whether the collector 110 is valid, and causes the collector 110 to start data collection when determining that the collector 110 is valid. This structure does not allow an invalid collector 110 to start data collection, and thus prevents the collector 110 from malfunctioning.

The controller 150 determines whether the collector 110 is valid depending on whether the error detection code generated in advance from the execution file 111a in the collection program 111 that implements the functions of the collector 110 matches the error detection code generated from the execution file 111a at the start of the data collection. Thus, whether the execution file 111a is valid is determined before the data collection is started. Thus, the execution file 111a corrupted after being created and before the data collection is started is unexecuted, and thus the collector 110 is prevented from malfunctioning. The same effect can be expected for the execution file 111a replaced with an invalid file after the execution file 111a is created and before the data collection is started.

When determining that the collector 110 is valid, the controller 150 provides setting data indicating setting details of data collection to the collector 110. When determining that the collector 110 is invalid, the collector 110 fails to receive setting data, and thus fails to perform data collection. This structure prevents the collector 110 from malfunctioning.

Modifications

Figure 11:
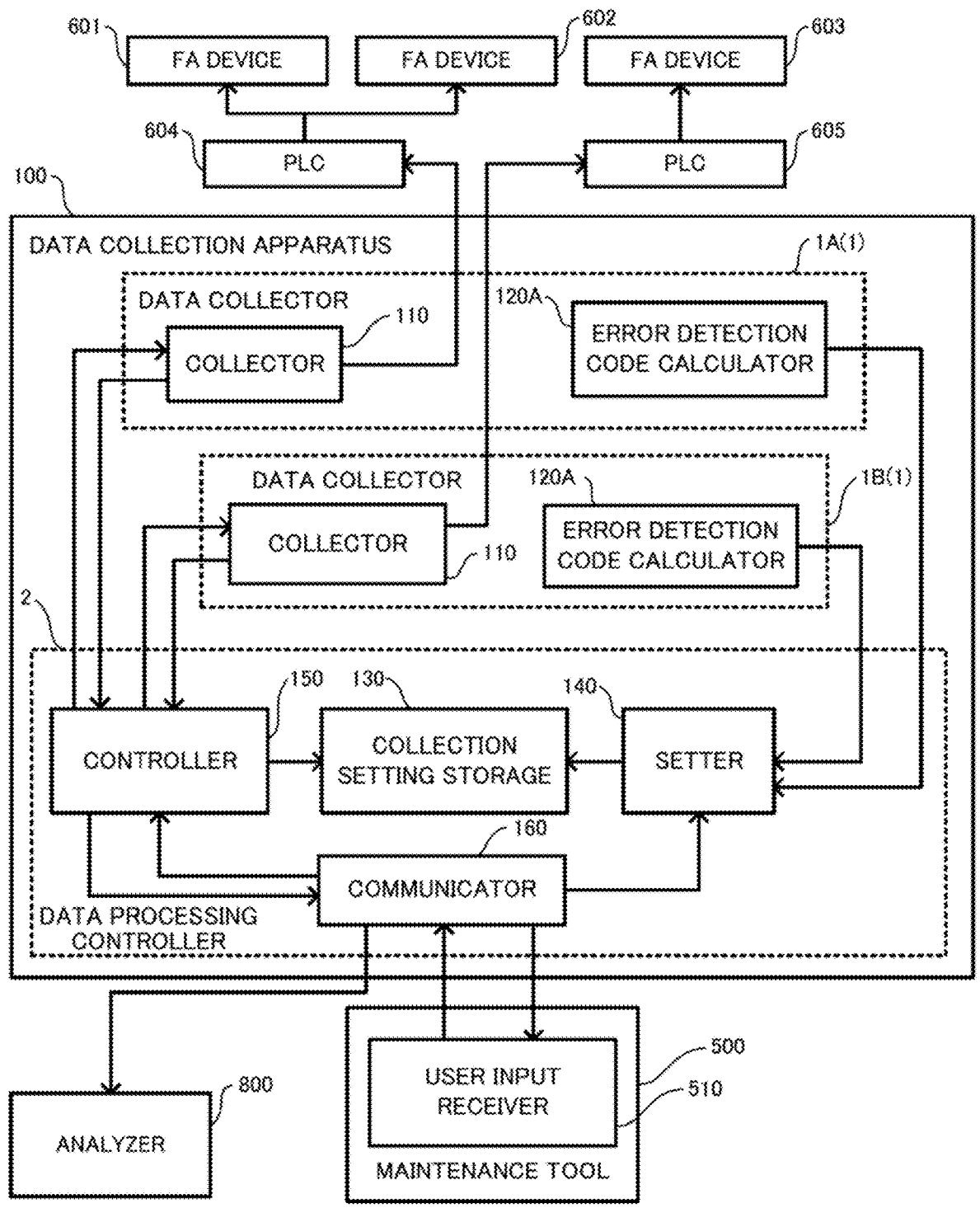
FIG. 11 is a functional block diagram of a data collection apparatus and a maintenance tool according to a modification.

As shown in FIG. 1, the data collector 1 in the embodiment described above includes the error detection code storage 120 that stores the error detection code calculated in advance. However, the data collector 1 need not include the error detection code storage 120. For example, as shown in FIG. 11, the data collector 1 may include an error detection code calculator 120A that calculates an error detection code. The calculator may pass the calculated error detection code to the setter 140 in the setting registration.

Figure 12:
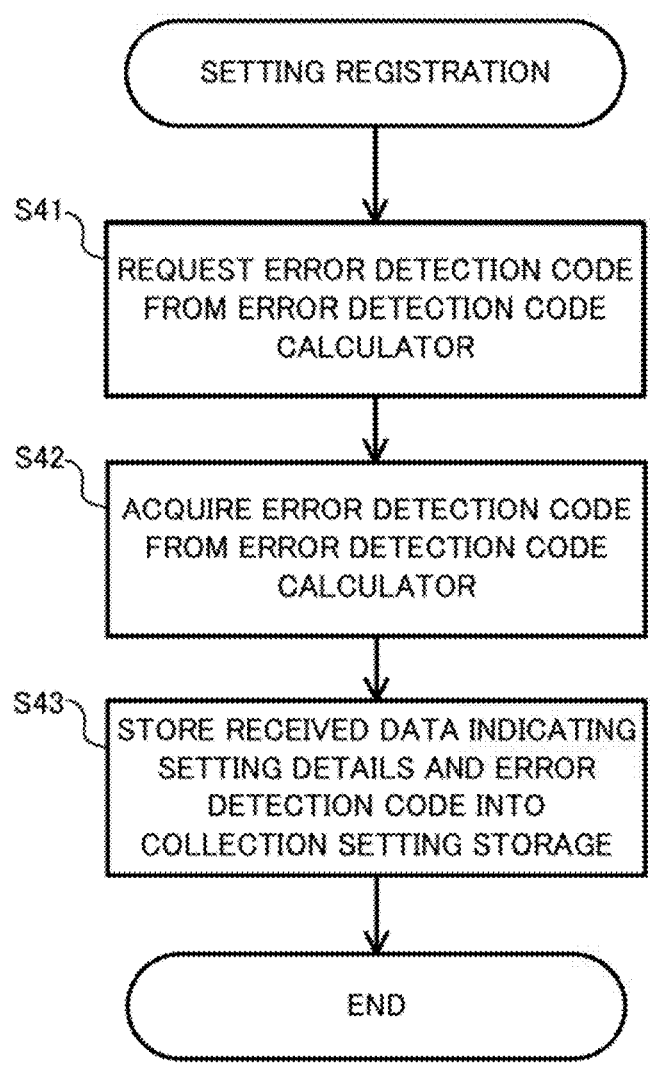
FIG. 12 is a flowchart of setting registration performed by the data collection apparatus according to the modification.

In this modification, upon receiving data indicating setting details of collection processing from the maintenance tool 500, the setter 140 starts setting registration shown in FIG. 12. The setter 140 first requests an error detection code from the error detection code calculator 120A in the data collector 1 shown in FIG. 11 (step S41). In response to this, the error detection code calculator 120A calculates the error detection code. The setter 140 acquires the error detection code from the error detection code calculator 120A (step S42). Subsequently, the setter 140 stores, as setting data, data indicating setting details of collection processing received from the maintenance tool 500, the execution file name and the path, and the error detection code read in step S42 into the collection setting storage 130 shown in FIG. 4 (step S43).

In the embodiment described above, as shown in FIG. 4, an IP address and a port number are used as examples of information identifying the device serving as a data collection target in the setting details for data collection. In some embodiments, the unit number on the network may be used as information identifying the device serving as a data collection target.

In the embodiments described above, the data collection apparatus 100 collects data from the FA devices 601 and 602 through the PLC 604, and collects data from the FA device 603 through the PLC 605. In some embodiments, the data collection apparatus 100 may collect data directly from the FA devices 601, 602, and 603.

The data collection apparatus 100 may perform predetermined data processing before transmitting collected data to the analyzer 800. For example, the data collection apparatus 100 may perform missing value processing or outlier processing on the collected data.

The setting data stored in the collection setting storage 130 shown in FIG. 4 may include end time information indicating the time for ending data collection. For example, the date and time to end data collection may be registered to the collection setting storage 130. The data collection apparatus 100 ends the data collection at the designated date and time. In some embodiments, the number of data items indicating the conditions for ending data collection may be registered to the collection setting storage 130. When the data collection apparatus 100 collects the designated number of data items, the data collection apparatus 100 ends the data collection.

In the embodiment described above, the data collection apparatus 100 and the analyzer 800 are different apparatuses. In some embodiments, a single apparatus may provide the functions of the data collection apparatus 100 and the analyzer 800, collect data, and analyze the collected data.

Examples usable as a recording medium that records the above programs include a non-transitory computer-readable recording medium including a magnetic disk, an optical disk, a magneto-optical disk, a flash memory, a semiconductor memory, and a magnetic tape.

The foregoing describes some example embodiments for explanatory purposes. Although the foregoing discussion has presented specific embodiments, persons skilled in the art will recognize that changes may be made in form and detail without departing from the broader spirit and scope of the invention. Accordingly, the specification and drawings are to be regarded in an illustrative rather than a restrictive sense. This detailed description, therefore, is not to be taken in a limiting sense, and the scope of the invention is defined only by the included claims, along with the full range of equivalents to which such claims are entitled.

REFERENCE SIGNS LIST

100 Data collection apparatus
1, 1A, 1B Data collector
2 Data processing controller
11, 51 Memory
12 Fieldbus interface
13 Tool interface
14, 55 CPU
19, 59 Bus 52 Communication interface
53 Input device
54 Display device
110 Collector
111 Collection program
111a Execution file
111b Redundant code
112 Collection control program
113 Setting program
114 Data processing program
120 Error detection code storage
120A Error detection code calculator
130 Collection setting storage
140 Setter
150 Controller
160 Communicator
500 Maintenance tool
510 Input receiver
511 Maintenance program
601, 602, 603 FA device
604, 605 PLC
701, 702 Network
800 Analyzer

The invention claimed is:

1. A data collection apparatus comprising:
a collector including a module of a program, the module being for implementing a function of performing data collection to collect data from a device; and
a controller to determine that the collector is valid when a first error detection code calculated for the module at a preset time matches a second error detection code calculated for the module at a time when an instruction to start the data collection is provided, and to cause, upon determining that the collector is valid, the collector to start the data collection.

2. The data collection apparatus according to claim 1, wherein the controller determines whether the collector is valid depending on whether the first error detection code matches the second error detection code calculated for the module included in the collector after the instruction to start the data collection is provided.

3. The data collection apparatus according to claim 1, wherein the controller, in response to the second error detection code failing to match the first error detection code, determines that the collector is invalid and does not cause the collector to start the data collection.

4. The data collection apparatus according to claim 1, further comprising:
an individual information storage to store the first error detection code.

5. The data collection apparatus according to claim 4, wherein
the collector is a plurality of the collectors,
the individual information storage is a plurality of the individual information storage each associated with a corresponding one of the plurality of collectors,
each of the plurality of individual information storage stores the first error detection code calculated in advance for the module included in the corresponding collector, and
the controller calculates the second error detection code for the module included in the collector after the instruction to start the data collection is provided by a user and before the controller causes the collector to start the data collection, and determines whether the collector is valid depending on whether the second error detection code matches the first error detection code calculated in advance.

6. The data collection apparatus according to claim 1, wherein
the first error detection code is a redundant code that is generated, from an execution file in the program for implementing the function of performing the data collection, in creation of the execution file, and
the controller generates a redundant code as the second error detection code from the execution file in the program before causing to start the data collection, and determines whether the collector is valid depending on whether the calculated second error detection code matches the first error detection code.

7. The data collection apparatus according to claim 6, wherein the controller executes the execution file in response to the collector being valid.

8. The data collection apparatus according to claim 1, wherein
the controller provides setting data indicating a setting for the data collection to the collector upon determining that the collector is valid,
the setting data includes information identifying the device, and
the collector collects data from the device indicated by the information identifying the device.

9. The data collection apparatus according to claim 8, wherein
the setting data further includes time interval information indicating an interval at which data is collected, and
the collector collects data from the device at the interval indicated by the time interval information.

10. The data collection apparatus according to claim 8, wherein
the setting data further includes end time information indicating a time for ending the data collection, and
the collector ends the data collection at the time indicated by the end time information.

11. A method comprising:
determining, for an execution file in a collection program for performing data collection to collect data from a device, whether the execution file is valid depending on whether a first error detection code calculated for the execution file at a preset time matches a second error detection code calculated for the execution file at a time when an instruction to start the data collection is provided; and
executing the collection program in response to the execution file being valid.

12. A non-transitory recording medium storing a program for causing a computer to perform operations comprising:
determining, for an execution file in a collection program for performing data collection to collect data from device, whether the execution file is valid depending on whether a first error detection code calculated for the execution file at a preset time matches a second error detection code calculated for the execution file at a time when an instruction to start the data collection is provided; and
executing the collection program in response to the execution file being valid.

13. The data collection apparatus according to claim 1, wherein the device includes a factory automation device.

* * * * *